United States Patent
Talwar et al.

(10) Patent No.: US 6,300,208 B1
(45) Date of Patent: Oct. 9, 2001

(54) METHODS FOR ANNEALING AN INTEGRATED DEVICE USING A RADIANT ENERGY ABSORBER LAYER

(75) Inventors: Somit Talwar; Gaurav Verma, both of Palo Alto, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/505,264

(22) Filed: Feb. 16, 2000

(51) Int. Cl.⁷ .................................................. H01L 21/336
(52) U.S. Cl. .................. 438/308; 438/301; 438/516; 438/530
(58) Field of Search .............................. 438/308, 301, 438/516, 530

(56) References Cited

U.S. PATENT DOCUMENTS

| | | | |
|---|---|---|---|
| 4,431,459 | 2/1984 | Teng | 148/1.5 |
| 4,472,456 | 9/1984 | Shah | 427/53.1 |
| 5,032,233 | 7/1991 | Yu et al. | 204/192.28 |
| 5,401,666 | 3/1995 | Tsukamoto | 437/41 |
| 5,405,804 | 4/1995 | Yabe | 437/773 |
| 5,523,262 | 6/1996 | Fair et al. | 437/248 |
| 5,569,398 | 10/1996 | Sun et al. | 219/121.68 |
| 5,569,624 | 10/1996 | Weiner | 437/200 |
| 5,612,235 | 3/1997 | Wu et al. | 437/41 |
| 5,614,729 | 3/1997 | Ukai et al. | 257/57 |
| 6,072,222 | * 6/2000 | Nistler | 257/383 |

\* cited by examiner

Primary Examiner—Long Pham
(74) Attorney, Agent, or Firm—Allston L. Jones

(57) ABSTRACT

The invented method can be used to melt and recrystallize the source and drain regions of an integrated transistor device(s) using a laser, for example. The invented method counteracts shadowing and interference effects caused by the presence of the gate region(s) during annealing of the source and drain regions with radiant energy generated by a laser, for example. The invented method includes forming a radiant energy absorber layer over at least the gate region(s) of an integrated transistor device(s), and irradiating the radiant energy absorber layer with radiant energy to generate heat in the source and drain regions as well as in the radiant energy absorber layer. The heat generated in the radiant energy absorber layer passes through the gate region(s) to portions of source and drain regions of the integrated transistor device(s) adjacent the gate region(s). The thermal energy supplied from the radiant energy absorber layer to the portions of the source and drain regions adjacent the gate region(s) can be used to offset the radiant energy lost in these portions of the source and drain regions through shadowing and interference effects. The invention is also directed to an article that includes the radiant energy absorber layer.

55 Claims, 9 Drawing Sheets

METHODS FOR ANNEALING AN INTEGRATED DEVICE USING A RADIANT ENERGY ABSORBER LAYER

GOVERNMENT RIGHTS

This invention was made with Government support under contract number N66001-95-C-8002 awarded by the Space and Naval Warfare Systems Command, San Diego. The Government has certain rights in the invention.

BACKGROUND OF THE INVENTION

1. Field of the Invention

This invention is directed to a method for annealing the source and drain regions of an integrated transistor device. More specifically, the invention can be used to melt and recrystallize the source and drain regions of an integrated transistor device to activate the junction thereof for proper electrical performance.

2. Description of the Related Art

As scaling of integrated devices progresses to below one-tenth of a micrometer (0.1 $\mu$m) with gate oxide thicknesses below thirty Angstroms (30 Å), severe problems are created by depletion of polysilicon gates, gate resistance and gate leakage. These problems have generated renewed interest in the use of metals for gates and alternative oxides for use as gate dielectric layers in processes for forming integrated devices. However, the use of metals for the gate electrode poses serious problems. Many processes for forming integrated devices involve a high-temperature anneal step in which the substrate is heated, often for extended periods of time, to activate the source and drain regions. This sort of extended thermal treatment is extremely destructive to most types of metals or dielectric stacks (i.e., multilayer structures that include conductive and dielectric layers) used for gate electrodes. Present proposals to overcome this problem add significant complexity to the process for forming an integrated device. It would thus be desirable to provide a relatively simplified method for forming an integrated device in which activation of the source and drain regions can be performed without adverse impact on the gate electrode.

One method for annealing source and drain regions without subjecting metal gates to destructive heating relies upon the use of relatively intense radiant energy generated by a laser or lamp, for example. However, the use of radiant energy for annealing the junction of an integrated device poses its own problems. By way of background to explain these problems, FIG. 1 shows a cross-section of an integrated device, in this case a metal-insulator-semiconductor field-effect transistor (MISFET) 1 that is formed in an active region of the substrate that is bounded and electrically isolated by field isolation region 3. A well region 4 is formed in the active region by introducing dopants into the semiconductor substrate 2. A gate region 7 is fabricated on the substrate 2 by forming a gate insulator layer 8 and a gate conductor layer 9, and patterning these layers by selective etching, for example, so that these layers overlie a limited portion of the active region that is to serve as the channel region of the integrated device 1. Dopants of opposite type as that of the well region 4 are implanted in the active region to form the source region 5 and drain region 6 on opposite sides of the gate region 7. To melt and recrystallize the source and drain regions 5, 6 for activation, a laser or lamp is used to generate radiant energy 10 which is directed to the source and drain regions. As shown in FIG. 1, the fact that the gate region 7 extends higher than the source and drain regions 5, 6 causes the radiant energy to be partially blocked in those portions of the source and drain regions 5, 6 immediately adjacent the gate region 7. Also, the relatively sharp features at the edges of gate region 7 cause the radiant energy 10 to diffract and generate interference patterns on the source and drain regions adjacent the gate. These shadowing and interference effects, represented by numeral 11 in FIG. 1, reduce the amount of radiant energy in the source and drain regions 5, 6 near the gate region's edge as compared to portions of the source and drain regions that are relatively distant from the gate region's edge. The reduction of radiant energy absorption in the portions of the source and drain regions 5, 6 adjacent the gate region 7 make it relatively difficult to melt such portions of the source and drain regions. Furthermore, at the portions of the source and drain regions 5, 6 adjacent the field isolation regions 3, the relatively poor thermal conductivity of the field isolation regions as well as optical interference effects, can lead to excessive melting beyond the desired source and drain boundaries into the substrate 2, a problem that can adversely affect electrical isolation of the device and significantly degrade the device's performance. Thus, the fluence of the radiant energy used for the annealing step must be controlled within a relatively narrow range to affect melting of the edges of the source and drain regions 5, 6 both near the field isolation region 3 and the gate region 7 without melting the underlying substrate 2. Simultaneous achievement of these constraints in previous methods for forming an integrated device is typically very difficult, if not impossible. It would be desirable to provide a method in which annealing of the source and drain regions of a transistor can be performed with radiant energy so as not to melt the metal gate conductor layer 9 while achieving relatively uniform melting of the source and drain regions 5, 6 to enhance the process margin available for successful performance of the method beyond that attainable with previous technologies.

SUMMARY OF THE INVENTION

Overcoming the above-noted disadvantages is the object of the present invention, and does in fact overcome such disadvantages. A preferred embodiment of the invented method includes forming a radiant energy absorber layer over a gate region of at least one transistor device, and irradiating the radiant energy absorber layer with radiant energy, preferably from a laser. The irradiating step generates heat in the radiant energy absorber layer that passes through the gate region to portions of the integrated device's source and drain regions that are adjacent to the gate region. The invented method permits the portions of the source and drain regions adjacent the gate region to be melted through transfer of heat from the radiant energy absorber layer to counteract shadowing and interference effects that limit the amount of radiant energy received by such portions of the source and drain regions. Melting and recrystallization through radiant energy irradiation can thus be performed more uniformly over the entire extent of the source and drain regions to significantly enhance the process margin available for activation annealing of the source and drain regions relative to previous methods.

The radiant energy absorber layer is composed of a material with a reflectivity that is lower than that of the source and drain regions. Preferably, the reflectivity of the radiant energy absorber layer is at least ten percent (10%) less than the reflectivity of the source and drain regions. This difference in reflectivity causes the temperature of the radiant energy absorber layer to be raised above that of the source and drain regions upon irradiation of the integrated transistor device with radiant energy to create a temperature gradient between the radiant energy absorber layer and the portions of the source and drain regions that are adjacent to the gate region. The temperature gradient causes heat to flow from the radiant energy absorber layer through the gate region to portions of the source and drain regions adjacent the gate region to permit such regions to be melted and recrystallized. The radiant energy absorber layer can be composed of a variety of substances with relatively high melting temperatures including titanium (Ti), titanium nitride (TiN), tantalum (Ta), tantalum nitride (TaN), tungsten nitride (WN), tungsten (W), and platinum (Pt). Preferably, the radiant energy absorber layer is formed to a thickness that is sufficient to absorb at least ninety (90%) of the radiant energy incident to the radiant energy absorber layer. Generally, a thickness of from ten (10) to one-thousand (1,000) nanometers is sufficient to absorb this amount of incident radiant energy. The radiant energy absorber layer can be formed using physical vapor deposition (PVD), chemical vapor deposition (CVD) or plasma-enhanced chemical vapor deposition (PECVD), for example.

The radiant energy fluence used in the irradiation step is sufficiently low so that the substrate, the gate insulator layer, the gate conductor layer and the radiant energy absorber layer are not melted, and yet is sufficiently high to melt the source and drain regions both through direct irradiation of the source and drain regions relatively distant from the gate region 7 as well as through heat transfer from the radiant energy absorber layer through the gate region into portions of the source and drain regions adjacent to the gate region that receive a reduced amount of radiant energy due to shadowing and interference effects. The irradiation step can be performed with laser radiant energy of from one (1) to ten (10) shots with a pulse width of five (5) to one thousand (1,000) nanoseconds and a fluence of one-tenth (0.1) to one (1.0) Joules per square centimeter at a wavelength in the range from one hundred (100) to one thousand two hundred (1,200) nanometers.

The method can include amorphizing the source and drain regions before irradiating the transistor device with radiant energy to reduce the melting temperature of the source and drain regions well below those of the other elements of the transistor device. In addition, process margins for the invented method are enhanced through the use of high-temperature materials for the gate insulator layer, the gate conductor layer and the radiant energy absorber layer. For example, the gate insulator layer can be composed of silicon oxide ($SiO_2$), silicon nitride ($Si_3N_4$), aluminum oxide ($Al_2O_3$), titanium oxide ($TiO_2$), barium strontium titanium oxide ($BaSrTiO_3$), and tantalum oxide ($Ta_2O_5$), formed by thermal annealing, remote plasma oxidation, physical vapor deposition (PVD), or chemical vapor deposition (CVD). The gate conductor layer can be composed of metals such as manganese (Mn), niobium (Nb), aluminum (Al), tantalum (Ta), molybdenum (Mo), zircon (Zr), titanium (Ti), palladium (Pd), rhenium (Re), iridium (Ir), platinum (Pt), tungsten (W), titanium nitride (TiN), tantalum nitride (TaN), tungsten nitride (WN) or alloys thereof, formed by physical vapor deposition (PVD), chemical vapor deposition (CVD) or plasma enhanced chemical vapor deposition (PECVD), for example. In a preferred embodiment of the invented method, the gate insulator layer is formed over the substrate followed by the gate conductor layer and the radiant energy absorber layer, which are patterned by selective etching to define the gate insulator layer and the gate conductor layer as a gate region which is overlaid by the radiant energy absorber layer.

The invention is also directed to an article of manufacture that includes a radiant energy absorber layer on the gate region of a transistor device which counters shadowing and interference effects adjacent to the gate region during irradiation with radiant energy to anneal the device's source and drain regions.

These together with other features and advantages, which will become subsequently apparent, reside in the details of construction and operation of the invention as more fully hereinafter described and claimed, reference being made to the accompanying drawings, forming a part hereof wherein like numerals refer to like parts throughout the several views.

DESCRIPTION OF THE PREFERRED EMBODIMENTS

As used herein, the terms "activation" or "annealing" refer to melting and recrystallizing the source and drain regions of a transistor device to assume a relatively highly-ordered state in which the dopant and substrate toms are regularly arranged in a crystalline lattice to obtain proper electrical performance of the device.

Figure 1:
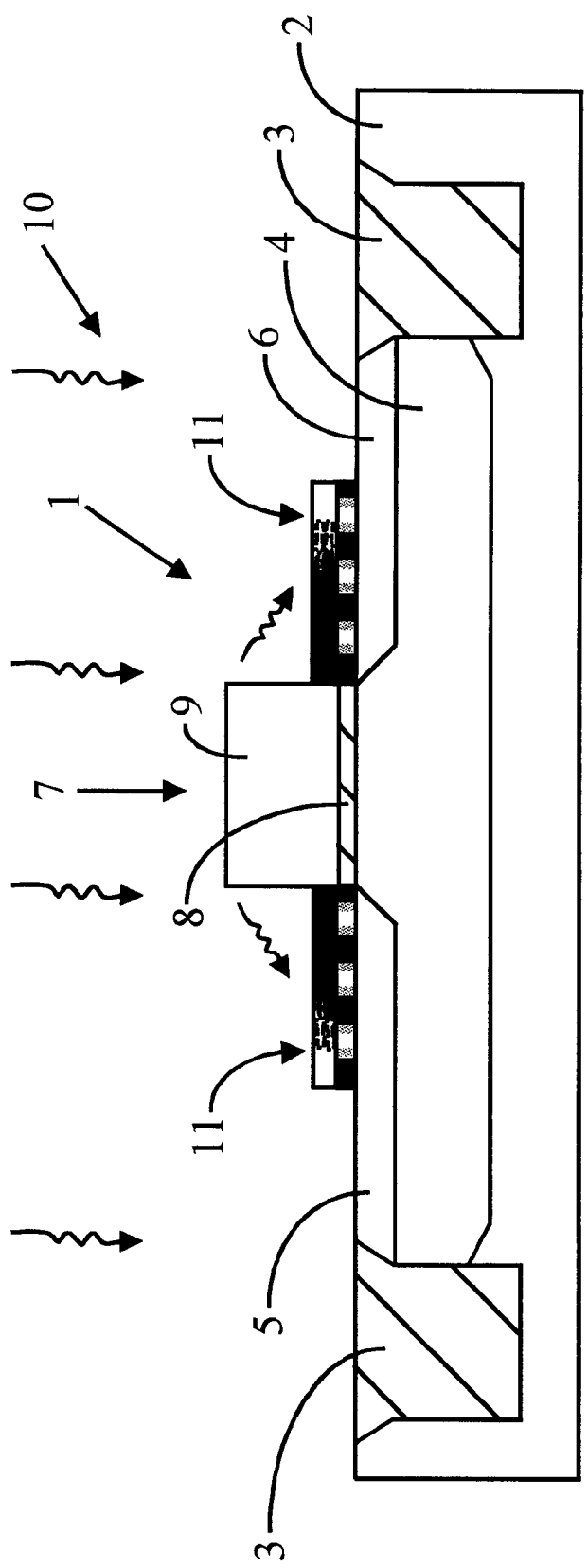
FIG. 1 is a view of shadowing and interference effects that occur upon irradiating, a gate region of a transistor device of the prior art to anneal the source and drain regions thereof.
Figure 2A:
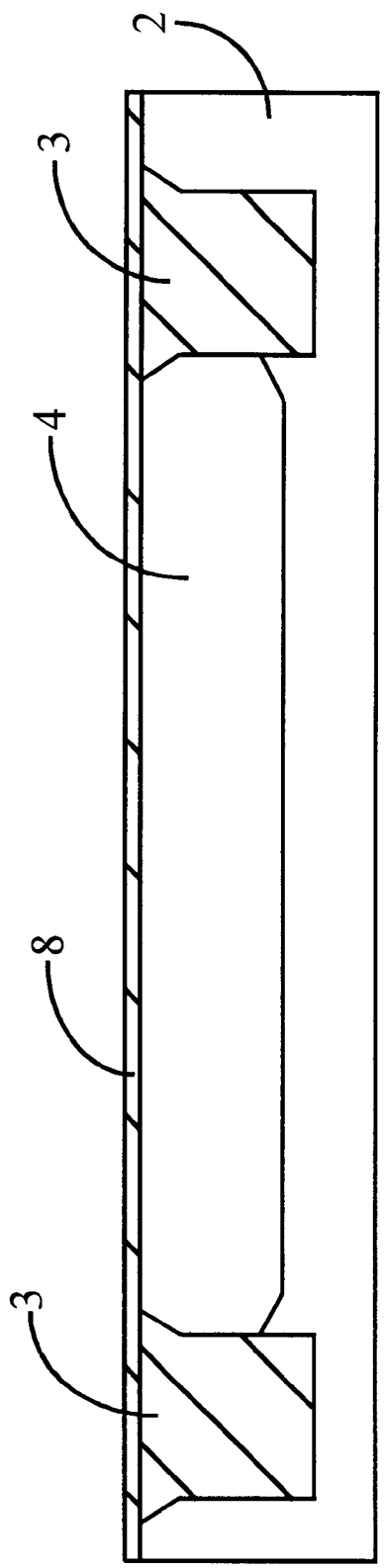
FIGS. 2A–2H are views of steps to form a transistor device in accordance with preferred embodiments of the invented method and article.

The invented method for making an integrated transistor device 1, and more specifically, for activation annealing of the source and drain regions of an integrated transistor device, is now described with reference to FIGS. 2A–2H. Referring to FIG. 2A, the integrated device is formed in a substrate 2 of appropriate material and crystallographic orientation. The substrate 2 can be any semiconductor material such as silicon, and can be in the form of a bulk substrate or a thin-film such as a semiconductor-on-insulator configuration, for example. The substrate 2 can be selectively oxidized to form a field isolation region such as a trench oxide for electrical isolation of the integrated transistor device. More specifically, one or more masking layer (s) can be made, for example, by selectively forming silicon oxide and silicon nitride layers over the substrate which expose the substrate in regions in which the trench oxide is to be formed. The masking layer(s) form a mask for etching trenches into the substrate, which are subjected to thermal oxidation to form a trench silicon oxide layer. Chemical vapor deposition (CVD) of silicon oxide in the trench can be performed to fill the trench with silicon oxide, followed by etching and/or polishing the substrate to remove the masking layer(s). Techniques such as that described above for forming a field isolation region which bounds an active area in which the integrated device is to be formed, are well-known in this technology. The size of the active area of the substrate 2 depends on the desired integration density, which can be as small as one micron or less. The field isolation region 3 serves to electrically isolate the integrated device from outside electromagnetic disturbances such as may be caused by other integrated devices formed on the substrate or other sources, and extends to a depth into the substrate sufficient to accomplish this purpose. If the substrate is composed of silicon, the field isolation region 3 is composed of silicon oxide upon oxidation. Optionally, prior to oxidation, a relatively high concentration of impurities of the same type as the well region 4 can be implanted deeply into the substrate to form a chanstop (not shown) underneath the field isolation region 3 for enhanced electrical isolation of the active area.

If the device to be formed is an n-channel device, p-type dopants are implanted to form the well region 4. Conversely, if the integrated device is to be a p-channel device, n-type dopants are implanted to form the well region 4. The depth to which the well region 4 is formed depends upon the scaling of the integrated device, and is generally on the order of hundreds to tens of thousands of nanometers for integration densities of one micron or less.

In FIG. 2A, a gate insulator layer 8 is formed on the substrate 2. The gate insulator layer 8 can be composed of substances such as silicon oxide ($SiO_2$), silicon nitride ($Si_3N_4$), aluminum oxide ($Al_2O_3$), titanium oxide ($TiO_2$), barium strontium titanium oxide ($BaSrTiO_3$), and tantalum oxide ($Ta_2O_5$). These substances have relatively high melting points which help to enhance the process margin available for the invented method. The gate insulator layer 8 can be formed with a variety of well-known techniques, including oxidation, physical vapor deposition (PVD), remote plasma oxidation, and chemical vapor deposition (CVD). The thickness of the gate insulator layer 8 depends upon the scaling of the integrated device and is generally many tens to hundreds of nanometers in thickness for device integration densities of about one micron, but can be formed in thicknesses below thirty (30) nanometers for sub-micron integration densities.

Optionally, dopants can be implanted into the channel region to adjust the gate threshold voltage of the integrated device. The channel dopants can be either p- or n-type, depending upon whether enhancement- or depletion-mode MISFET operation is desired. The channel dopants can be implanted through the gate insulator layer 8 using techniques that are well-known in this technology.

Figure 2B:
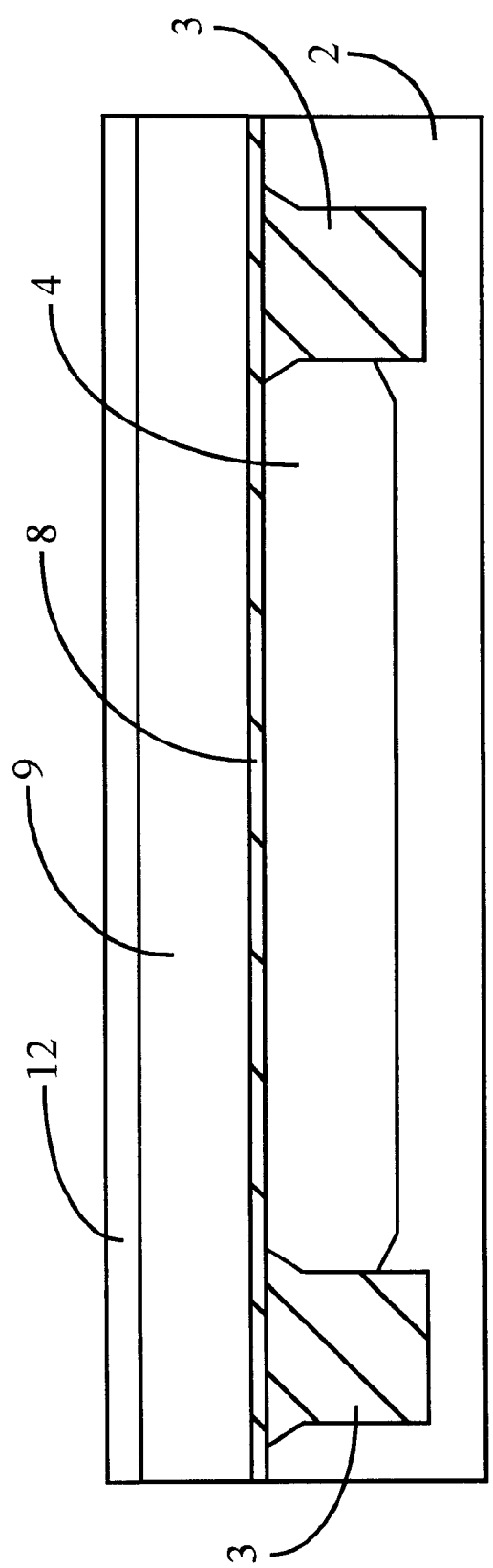

In FIG. 2B, a gate conductor layer 9 is formed over the gate insulator layer 8. The gate conductor layer 9 is formed of a metal or alloy that is electrically conductive. In addition, the gate conductor layer 9 should have a relatively high melting point to enhance the process margin available for performance of the invented method. The gate conductor layer 9 should also have a relatively high thermal conductivity. For example, the gate conductor layer 9 can be composed of manganese (Mn), niobium (Nb), aluminum (Al), tantalum (Ta), molybdenum (Mo), zircon (Zr), titanium (Ti), palladium (Pd), rhenium (Re), iridium (Ir), platinum (Pt), tungsten (W), titanium nitride (TiN), tantalum nitride (TaN), tungsten nitride (WN) or alloys thereof. The gate conductor layer 9 can be formed by chemical vapor deposition (CVD), physical vapor deposition (PVD), or plasma enhanced chemical vapor deposition (PECVD), for example. Preferably, the thickness of the gate conductor layer 9 is from fifty (50) to three-hundred (300) nanometers.

In FIG. 2B, a radiant energy absorber layer 12 is formed over the gate conductor layer 9. The radiant energy absorber layer 12 is composed of a substance that has a lower reflectivity as compared to the materials composing the source and drain regions (in general, the material composing the source and drain regions is the same as that of the substrate 2). Preferably, the material composing the radiant energy absorber layer 12 has a reflectivity that is at least ten percent (10%) lower than that of the material composing the source and drain regions. Examples of materials that can be used for the radiant energy absorber layer 12 include titanium (Ti), titanium nitride (TiN), tantalum (Ta), tantalum nitride (TaN), and tungsten nitride (WN) or other refractory metals or alloys thereof. The radiant energy absorber layer 12 can be formed using chemical vapor deposition (CVD), physical vapor deposition (PVD) or plasma enhanced chemical vapor deposition (PECVD), for example. Preferably, the thickness of the radiant energy absorber layer 12 should be sufficient to absorb ninety percent (90%) of the radiant energy refracted into the radiant energy absorber layer in the irradiation step of the invented method. To absorb this amount of radiant energy, the radiant energy absorber layer 12 is preferably formed to a thickness on the order of ten (10) to one-thousand (1,000) nanometers, although the invention is not limited to these thicknesses. The radiant energy absorber layer 12 can be formed on the gate conductor layer 9 using equipment such as a device produced under the trademark Endura™ that is commercially available from Applied Materials, Inc. of San Jose, Calif.

Figure 2C:
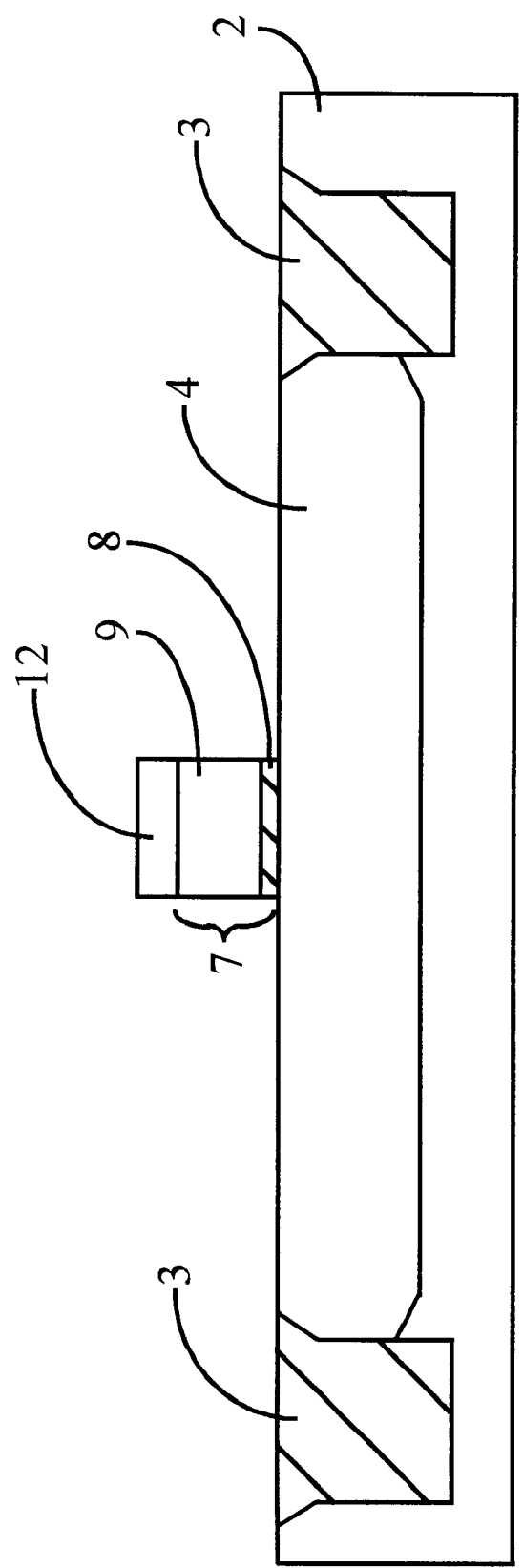

In FIG. 2C, the gate insulator layer 8, the gate conductor layer 9 and the radiant energy absorber layer 12 are patterned to define a gate region 7 overlain by the radiant energy absorber layer 12. As used herein, the gate region 7 refers to both the gate insulator layer 8 and the gate conductor layer 9 overlying the device's channel region. The gate insulator layer 8, the gate conductor layer 9 and the radiant energy absorber layer 12 can be patterned through a variety of conventional techniques, such as by selectively forming a resist layer over the gate region 7 and, in the same step, etching the gate insulator layer 8, the gate conductor layer 9 and the radiant energy absorber layer 12 using an etchant such as an acidic substance or reactive ion etching, for example, to remove portions of these layers from areas of the substrate in which the integrated device's source and drain regions are to be formed.

Figure 2D:
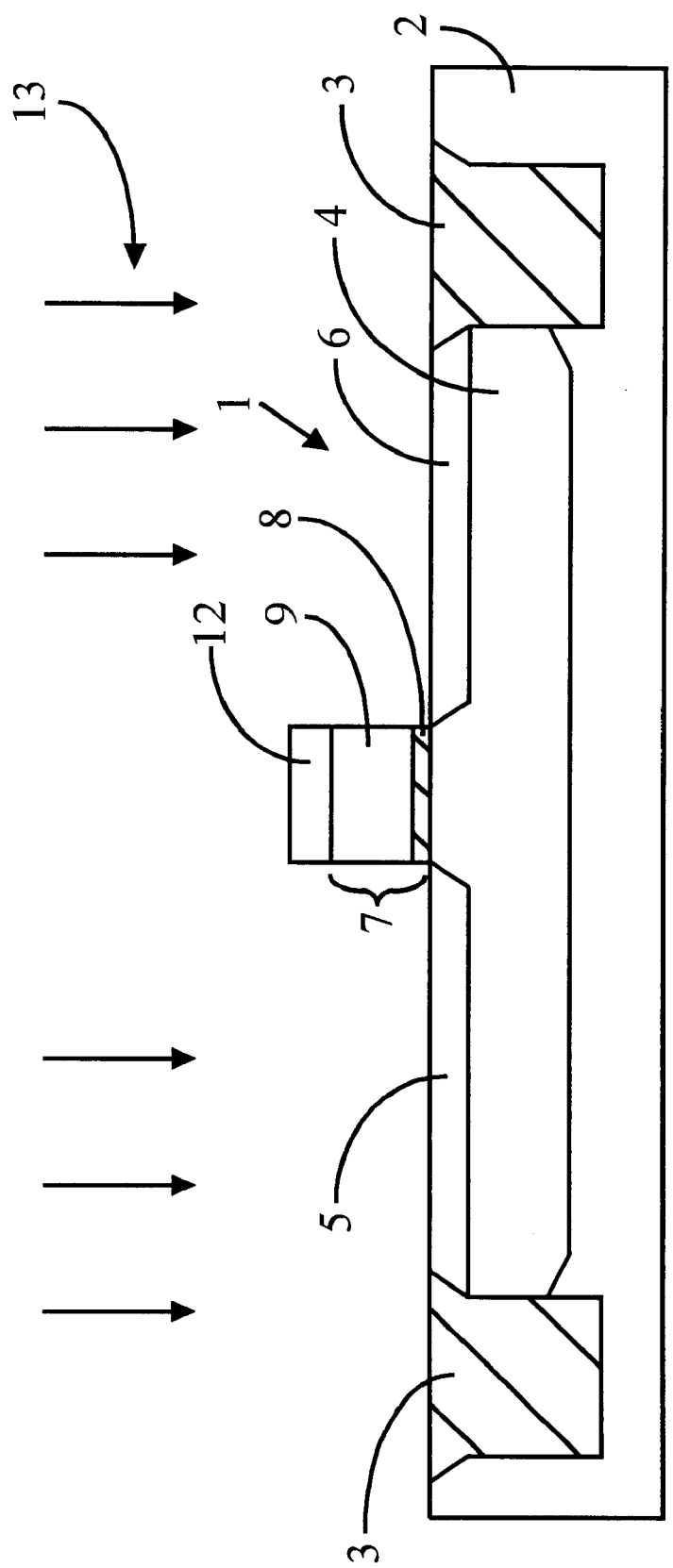

In FIG. 2D, ions 13 are implanted into the substrate 2 to amorphize localized portions of the substrate to form a source region 5 and a drain region 6 for the integrated device. The amorphization step destroys chemical bonds between the atoms of the source and drain regions 5, 6 to lower their melting temperatures well below those of the substrate 2, the field isolation region 3, the well region 4, the gate insulator layer 8, the gate conductor layer 9 and the radiant energy absorber layer 12. Preferably, the amorphized source and drain regions 5, 6 are formed to a depth on the order of tens to hundreds of nanometers. The ion species, the implantation energy and the dosage are selected to produce the amorphized regions to a predetermined depth to which silicidation is desired in the source and drain regions. In general, selecting an ion species with a relatively radiant energy atomic weight, increasing the ion implantation energy, or increasing the ion dosage, will each have the effect of increasing the depth to which the amorphous regions extend. Conversely, selecting an ion species with relatively heavy atomic weight, decreasing the ion implantation energy, or decreasing the ion dosage, will each have the effect of decreasing the depth to which the amorphous regions extend. A number of ion species can be used to produce the amorphous regions. For example, the ion species can include silicon, argon, arsenic, or germanium. The ion implantation energy can be in a range from 2 to 100 kilo-electronVolts (keV) at a dosage in a range from $10^{13}$ to $10^{15}$ ions per square centimeter. The ion implantation step can be performed with a variety of commercially-available equipment, including the 9500 XR Ion Implanter from Applied Materials, Inc. of San Jose, Calif.

Figure 2E:
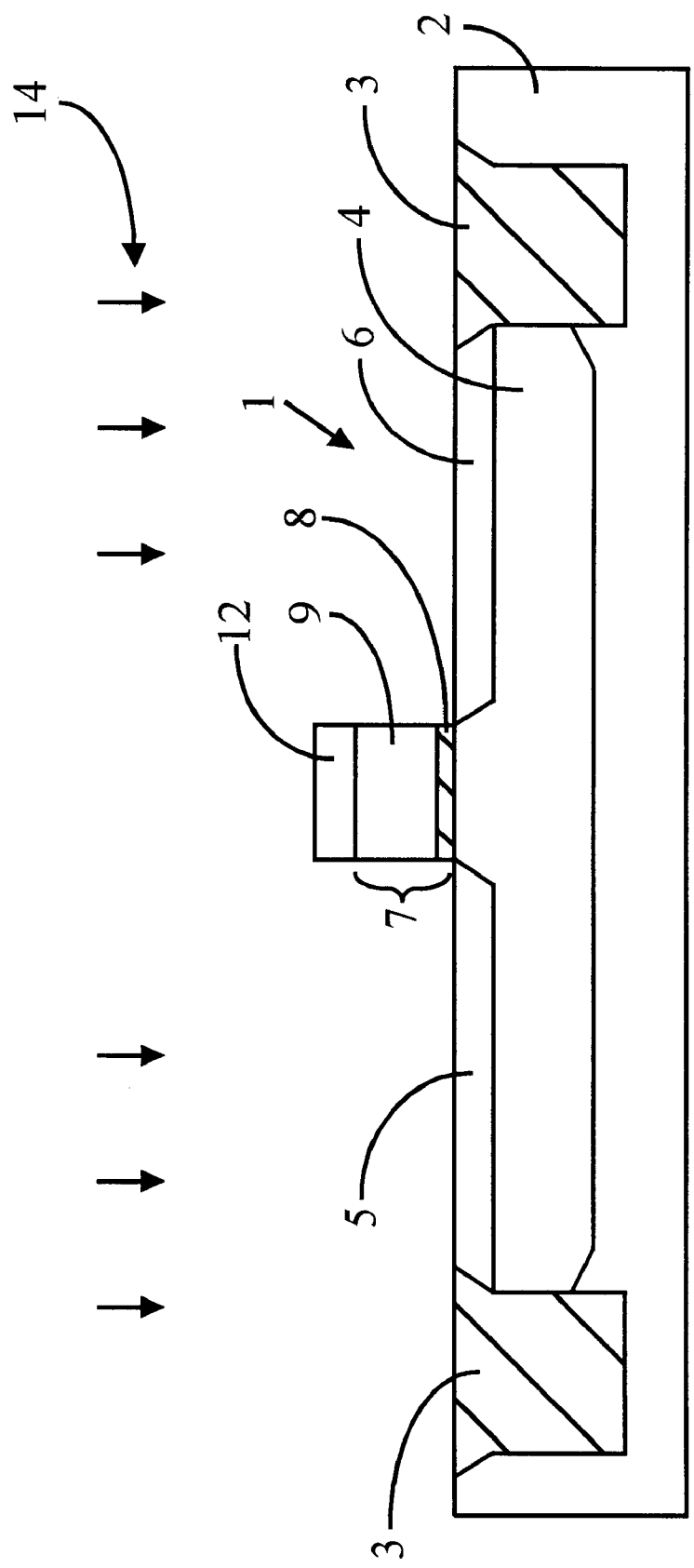

In FIG. 2E, dopants 14 are implanted into the source and drain regions 5, 6. If the integrated device 1 is a p-channel device, the implanted dopants are p-type, and conversely, if the device 1 is an n-channel device, the implanted dopant ions 14 are n-type. The dopants 14 can be implanted under similar conditions and with similar equipment as that stated above for the amorphization implant, although the dosage of the dopants 14 can range from $10^{13}$ to as high as $10^{18}$ ions per square centimeter. It should be noted that it is possible to combine the amorphization and dopant implantation steps of FIGS. 2D and 2E by using the same ion species both to affect amorphization of the source and drain regions as well as to introduce the dopants into the source and drain regions of the integrated transistor device 1.

Figure 2F:
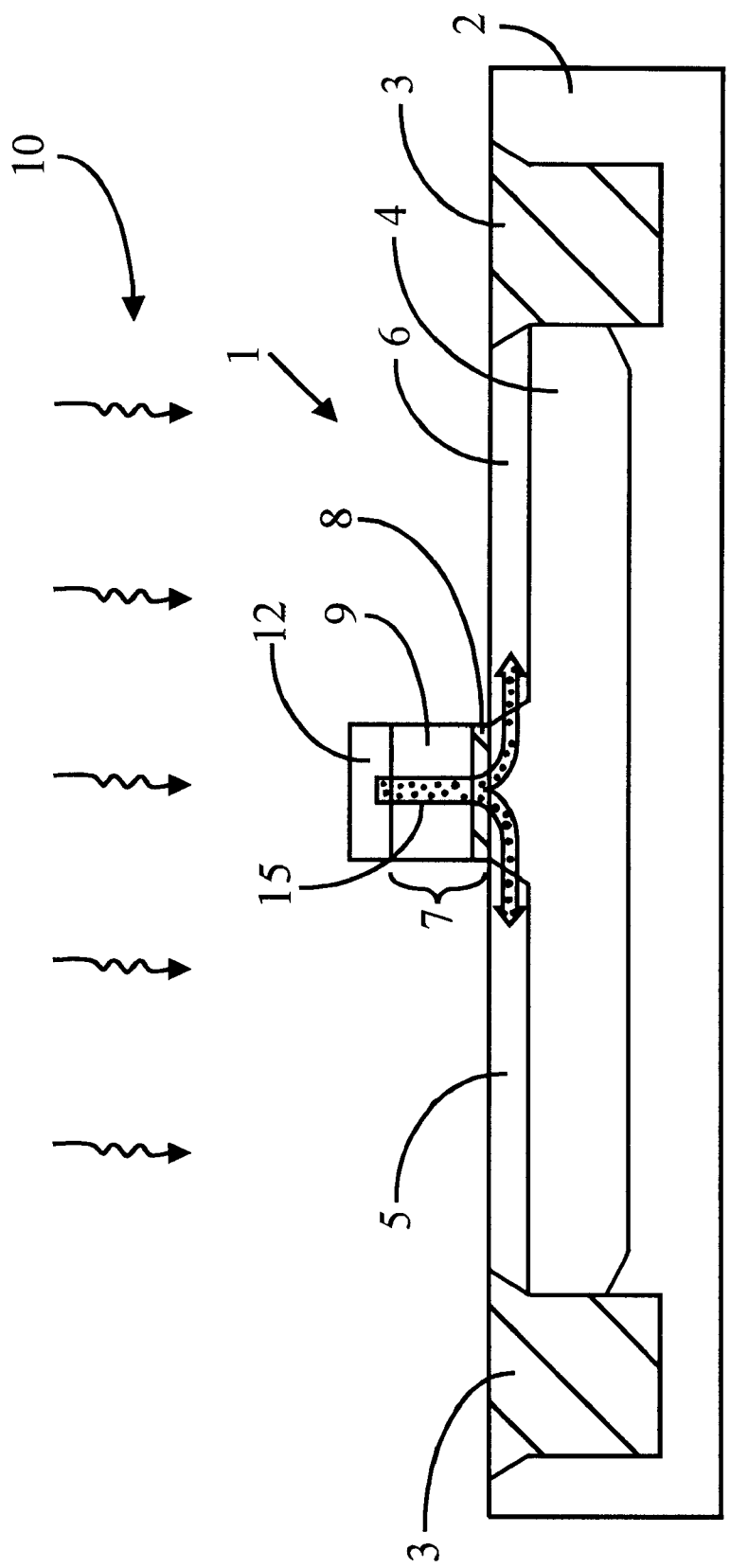

In FIG. 2F, the transistor device 1 is irradiated with radiant energy 10 to melt and recrystallize the source and drain regions 5, 6 for activation annealing. The fluence of the radiant energy used to irradiate the integrated device 1 can be from one-tenth (0.1) to one (1.0) Joules per square centimeter delivered in from one to ten shots with a pulse width of five to one thousand nanoseconds at a wavelength in a range of one hundred (100) to one thousand two hundred (1,200) nanometers. As shown in FIG. 2F, a significant portion of the radiant energy irradiated on the radiant energy absorber layer 12 is converted to heat. Because the radiant energy absorber layer 12 is less reflective than the source and drain regions 5, 6, the temperature of the radiant energy absorber layer 12 is raised significantly above that of the source and drain regions 5, 6 so that heat 15 flows from the radiant energy absorber layer 12 through the gate conductor layer 9 and the gate insulator layer 8 of the gate region 7, into the channel region to the source and drain regions 5, 6 adjacent the gate region 7. Preferably, the additional heat supplied to the source and drain regions 5, 6 adjacent the gate region 7 is sufficient to make up for the radiant energy that is lost by shadowing and interference effects so that the source and drain regions 5, 6 are more uniformly heated and melted over their entire extent. By causing the source and drain regions 5, 6 to be melted at a more uniform temperature, the radiant energy absorber layer 12 makes it possible to greatly enhance the process margin available for performance of the invented method beyond that of previous methods. The radiant energy 10 used in the irradiation step of the invented method can be generated by a laser such as the model no. 4308 commercially available from Lamda Physik of Fort Lauderdale, Fla.

Optionally, after performance of the irradiation step of the invented method, the radiant energy absorber layer 12 can be removed by etching, for example. However, if the radiant energy absorber layer 12 is composed of a material that is sufficiently electrically-conductive to transmit signals or voltage levels to the gate conductor layer 9, it is preferred for the sake of simplicity not to remove the radiant energy absorber layer 12 because its removal adds an additional step to the invented method. Thus, if the desired electrical performance for the integrated device 1 can be obtained using the radiant energy absorber layer 12 for electrical contact to the gate conductor layer 9, it is preferred not to remove the radiant energy absorber layer 12.

Figure 2G:
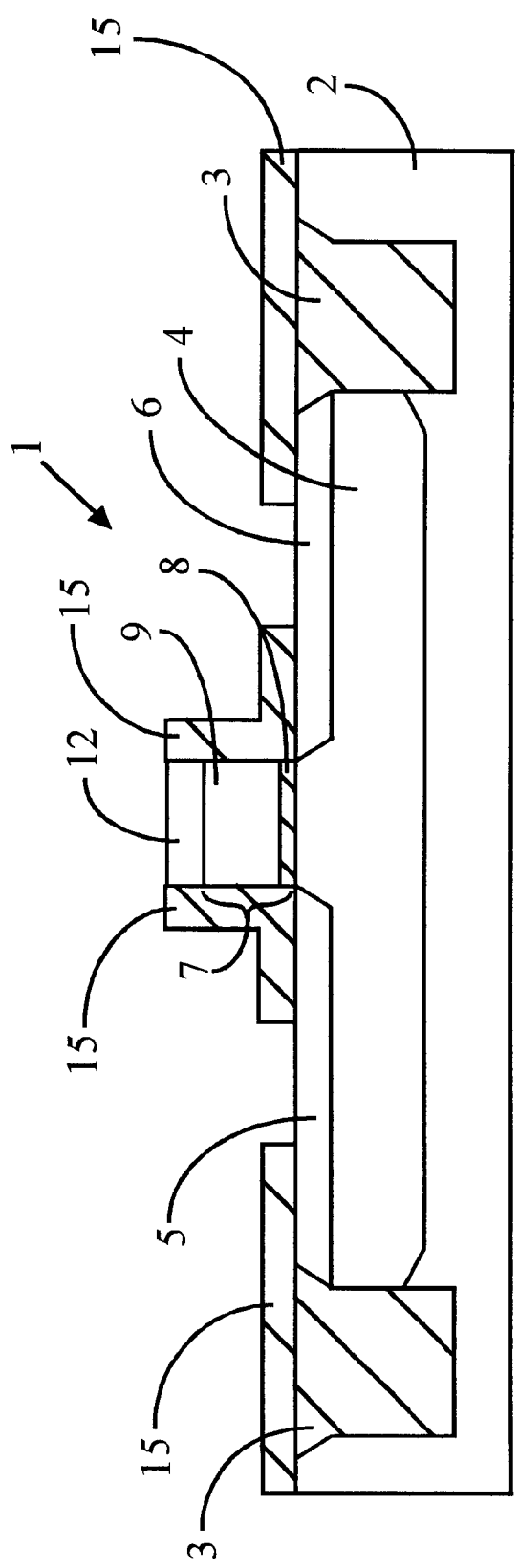

In FIG. 2G, to complete the manufacture of the integrated device 1, an insulator layer 15 is formed over the substrate 2 and is patterned to define contact holes that expose the source and drain regions 5, 6. The insulator layer 15 can be composed of silicon oxide ($SiO_2$) which can be doped with phosphorous to form "P-glass." Alternatively, the insulator layer 15 can be composed of other dielectric substances such as silicon nitride ($Si_3N_4$), for example. The insulator layer 15 can be formed through a variety of well-known conventional techniques.

Figure 2H:
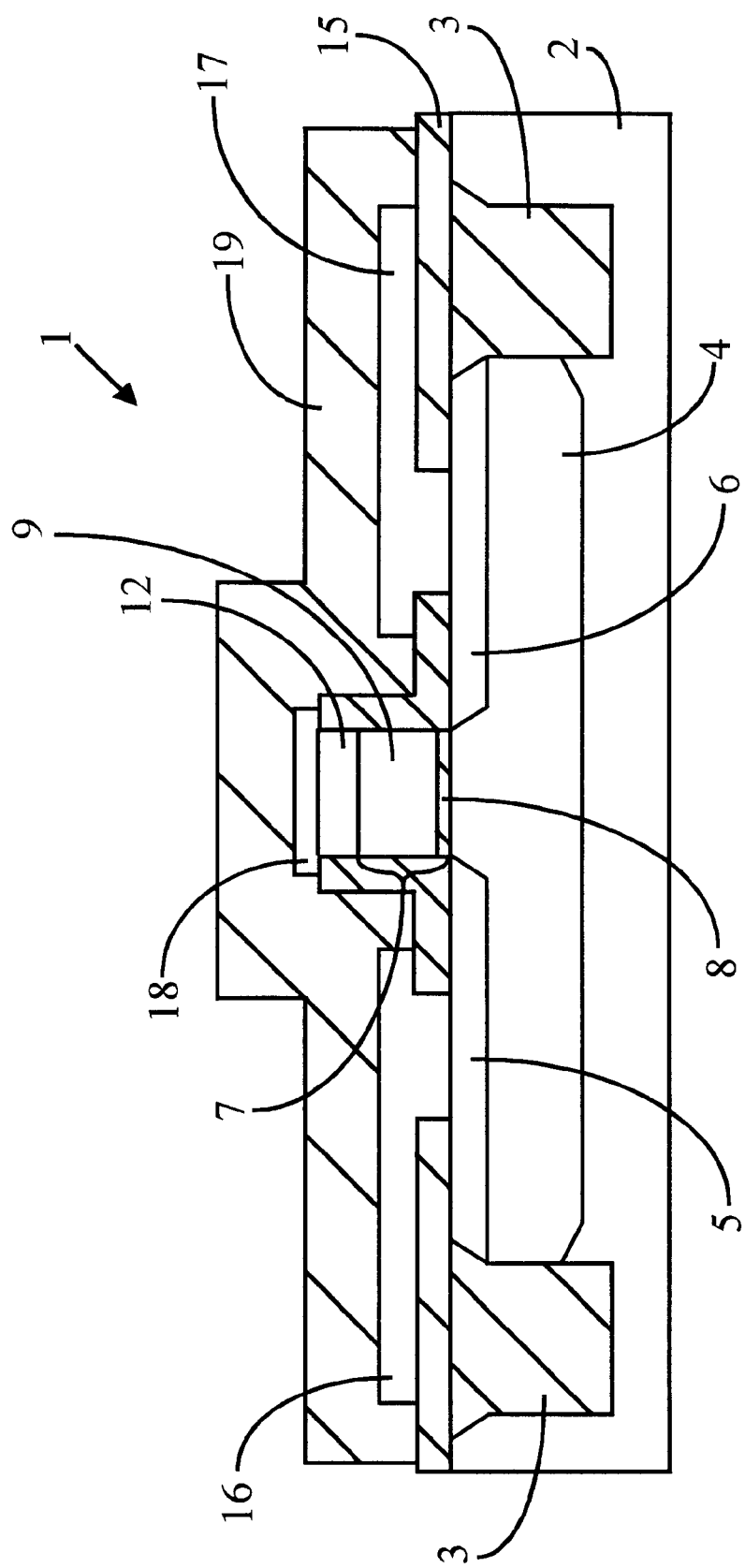

In FIG. 2H, a metal layer is formed over the insulator layer 15 to make electrical connections to the source and drain regions 5, 6 and the gate conductor layer 9. The metal layer can be composed of a variety of metal species, including aluminum, copper, or gold. The metal layer is patterned to define a source conductive line 16, a drain conductive line 17 and a gate conductive line 18 to couple the source, drain and gate, respectively, to signal or power sources or other integrated devices (not shown) formed in the substrate 2. An insulator layer 19 is formed over the insulator layer 15 and the conductive lines 16, 17, 18 for electrical insulation and protection. Techniques for forming and patterning the insulator layers 15, 19 and the conductive lines 16, 17, 18, are well-known in the art.

Although the method described above with reference to FIGS. 2A–2H has been made with regard to the formation of a single integrated device, those of ordinary skill in this technology will understand that the invented method can be applied to the simultaneous formation and annealing of numerous integrated devices on a semiconductor substrate as is commonly done in the semiconductor industry. Accordingly, the description with reference to forming a single integrated device should in no way limit application of the invented method to formation of a single integrated device.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed is:

1. A method comprising the steps of:
   a) forming a radiant energy absorber layer over a gate region of at least one transistor device; and
   b) irradiating the transistor device with radiant energy to generate heat in source and drain regions, and to generate heat in the radiant energy absorber layer that passes through the gate region to portions of source and drain regions of the integrated transistor device adjacent the gate region;
      wherein the radiant energy used in said step b) is laser radiant energy irradiated in from one to ten shots with a pulse width of five to one thousand nanoseconds and a fluence of one-tenth (0.1) to one (1.0) Joules per square centimeter at a wavelength of one-tenth (0.1) to two (2) micrometers.

2. A method as claimed in claim 1, wherein the radiant energy absorber layer includes at least one layer of one of titanium (Ti), titanium nitride (TiN), tantalum (Ta), tantalum nitride (TaN), tungsten nitride (WN), tungsten (W), and platinum (Pt).

3. A method as claimed in claim 1, wherein said radiant energy absorber layer is composed of a material pre-selected to have a reflectivity that is lower than the reflectivity of the source and drain regions.

4. A method as claimed in claim 1, wherein absorptivity of the radiant energy absorber layer over the gate is greater as compared to absorptivity of the source and drain regions so that the radiant energy absorber layer over the gate attains a temperature that is significantly higher than the temperature of the source and drain regions adjacent the gate when irradiated with radiant energy in said step (b) so that heat energy flows from the radiant energy absorber layer through the gate region to the source and drain regions adjacent the gate region in the performance of said step (b).

5. A method as claimed in claim 1, wherein the integrated device is formed in a semiconductor substrate, and wherein the fluence of the radiant energy is sufficiently low so that the substrate is not melted, and yet is sufficiently high to melt amorphized source and drain regions both through direct irradiation of portions of the source and drain regions and by conduction from the relatively distant from the gate region as well as through heat transfer from the radiant energy absorber layer through the gate region into the source and drain regions adjacent to the gate region.

6. A method as claimed in claim 1, wherein said step (a) is performed using chemical vapor deposition (CVD).

7. A method as claimed in claim 1, wherein said step (a) is performed using plasma enhanced chemical vapor deposition (PECVD).

8. A method as claimed in claim 1, wherein said step (a) is performed using physical vapor deposition (PVD).

9. A method as claimed in claim 1, wherein the thickness of the radiant energy absorber layer is sufficient to absorb at least ninety percent (90%) of the radiant energy refracted into the radiant energy absorber layer in the performance of said step (b).

10. A method as claimed in claim 1, wherein the thickness of the radiant energy absorber layer is from ten (10) to one-thousand (1,000) nanometers.

11. A method as claimed in claim 1, wherein the gate region includes a gate insulator layer and a gate conductor layer, the method further comprising the steps of:
   prior to step a.:
      d) forming the gate insulator layer over the substrate;
      e) forming the gate conductor layer over the gate insulator layer; and
   following step a. and preceding step b.:
      f) patterning the gate insulator layer, the gate conductor layer and the radiant energy absorber layer to define the gate region and the radiant energy absorber layer overlying the gate region.

12. A method as claimed in claim 11, wherein the gate conductor layer includes at least one layer of one of manganese (Mn), niobium (Nb), aluminum (Al), tantalum (Ta), molybdenum (Mo), zircon (Zr), titanium (Ti), palladium (Pd), rhenium (Re), iridium (Ir), platinum (Pt), tungsten (W), titanium nitride (TiN), tantalum nitride (TaN), tungsten nitride (WN) or alloys thereof.

13. A method as claimed in claim 11, wherein the gate conductor layer is formed by chemical vapor deposition (CVD).

14. A method as claimed in claim 11, wherein the gate conductor layer is formed by plasma enhanced chemical vapor deposition (PECVD).

15. A method as claimed in claim 11, where in the gate conductor layer is formed by physical vapor deposition (PVD).

16. A method as claimed in claim 11, wherein the gate insulator layer includes at least one layer of one of silicon oxide ($SiO_2$), silicon nitride ($Si_3N_4$), aluminum oxide ($Al_2O_3$), titanium oxide ($TiO_2$), barium strontium titanium oxide ($BaSrTiO_3$), and tantalum oxide ($Ta_2O_5$).

17. A method as claimed in claim 11, wherein the gate insulator layer is formed by remote plasma oxidation.

18. A method as claimed in claim 11, wherein the gate insulator layer is formed by chemical vapor deposition (CVD).

19. A method as claimed in claim 11, wherein the gate insulator layer is formed by thermal oxidation.

20. A method as claimed in claim 11, wherein the gate insulator layer is formed by physical vapor deposition (PVD).

21. A method as claimed in claim 1, further comprising the step of:
   g) amorphizing the source and drain regions before performing said step (b).

22. A method as claimed in claim 21, wherein said step (g) is performed by ion implantation.

23. A method as claimed in claim 21, wherein said step (g) is performed by implanting germanium ions into the source and drain regions.

24. A method as claimed in claim 21, wherein said step (g) is performed by implanting silicon ions into the source and drain regions.

25. A method for forming at least one integrated transistor device on a semiconductor substrate, the method comprising the steps of:
   a) forming at least one field isolation region to bound and electrically isolate at least one active area of said semiconductor substrate;
   b) forming at least one well region with dopants of a first type in the active area of the substrate;
   c) forming a gate insulator layer over the substrate;
   d) forming a gate conductor layer over the insulating layer;
   e) forming a radiant energy absorber layer over the gate conductor layer;
   f) patterning the insulating layer, gate conductor layer and radiant energy absorber layer to define at least one gate region with the radiant energy absorber layer overlying the gate region;
   g) amorphizing source and drain regions adjacent the gate region;
   h) introducing dopants of a second type into the source and drain regions; and
   i) irradiating the integrated device with radiant energy of a fluence sufficiently high to melt the amorphized source and drain regions, yet sufficiently low to avoid melting of the underlying substrate and the gate structure.

26. A method as claimed in claim 25, wherein the field isolation region is formed of silicon oxide.

27. A method as claimed in claim 25, wherein said step (a) includes the substeps of:
   a1) forming a resist layer on the substrate;
   a2) patterning the resist layer to expose predetermined areas of the substrate in which the field isolation region is to be formed; and
   a3) oxidizing the areas of the substrate exposed by the resist layer to form the field isolation region.

28. A method as claimed in claim 25, wherein said step (b) includes a substep of implanting ions of the first type to form the well region, and a substep of annealing the well region to activate the implanted ions therein.

29. A method as claimed in claim 25, wherein the gate insulator layer includes at least one layer of one of silicon oxide ($SiO_2$), silicon nitride ($Si_3N_4$), aluminum oxide ($Al_2O_3$), titanium oxide ($TiO_2$), barium strontium titanium oxide ($BaSrTiO_3$), and tantalum oxide ($Ta_2O_5$).

30. A method as claimed in claim 25, wherein said step (c) includes the substep of forming the gate insulator layer by remote plasma oxidation.

31. A method as claimed in claim 25, wherein said step (c) includes the substep of forming the gate insulator layer by chemical vapor deposition (CVD).

32. A method as claimed in claim 25, wherein said step (c) includes the substep of forming the gate insulator layer by physical vapor deposition (PVD).

33. A method as claimed in claim 25, wherein the gate insulator layer is formed in said step (c) to a thickness less than thirty (30) nanometers.

34. A method as claimed in claim 25, wherein the gate conductor layer includes at least one layer of one of manganese (Mn), niobium (Nb), aluminum (Al), tantalum (Ta), molybdenum (Mo), zircon (Zr), titanium (Ti), palladium (Pd), rhenium (Re), iridium (Ir), platinum (Pt), tungsten (W), titanium nitride (TiN), tantalum nitride (TaN), tungsten nitride (WN) and alloys thereof.

35. A method as claimed in claim 25, wherein said step (d) includes the substep of forming the gate conductor layer by chemical vapor deposition (CVD).

36. A method as claimed in claim 25, wherein said step (d) includes the substep of forming the gate conductor layer by plasma enhanced chemical vapor deposition (PECVD).

37. A method as claimed in claim 25, wherein said step (d) includes the substep of forming the gate conductor layer by physical vapor deposition (PVD).

38. A method as claimed in claim 25, wherein the radiant energy absorber layer includes at least one layer of one of titanium (Ti), titanium nitride (TiN), tantalum (Ta), tantalum nitride (TaN), tungsten nitride (WN), tungsten (W), and platinum (Pt).

39. A method as claimed in claim 25, wherein the material composing the radiant energy absorber layer is pre-selected to have a reflectivity that is lower than the reflectivity of the source and drain regions.

40. A method as claimed in claim 25, wherein said step (e) is performed using chemical vapor deposition (CVD).

41. A method as claimed in claim 25, wherein said step (e) is performed using plasma enhanced chemical vapor deposition (PECVD).

42. A method as claimed in claim 25, wherein said step (e) is performed using plasma enhanced chemical vapor deposition (PVD).

43. A method as claimed in claim 25, wherein the thickness of the radiant energy absorber layer formed in said step (e) is sufficient to absorb at least ninety (90%) of the radiant energy passing into the radiant energy absorber layer in said step (i.).

44. A method as claimed in claim 25, wherein the thickness of the radiant energy absorber layer formed in said step (e) is from ten (10) to one-thousand (1,000) nanometers.

45. A method as claimed in claim 25, wherein the melting temperatures of the substrate, the gate insulator layer, the gate conductor layer and the radiant energy absorber layer are above that of the amorphized source and drain regions.

46. A method as claimed in claim 25, wherein said step (f) includes the substeps of:

f1) forming a resist layer on the radiant energy absorber layer;

f2) patterning the resist layer to expose portions of the radiant energy absorber layer outside of the gate region;

f3) etching the radiant energy absorber layer, the gate conductor layer and the gate insulator layer; and f4) removing the resist layer.

47. A method as claimed in claim 25, wherein said step (g) includes the substep of implanting ions of a species including at least one of silicon, argon, arsenic and germanium with an implantation energy from five (5) to one-hundred (100) kilo-electron Volts (KeV) and with a dosage in a range from $10^{13}$ to $10^{16}$ atoms per square centimeter.

48. A method as claimed in claim 25, wherein said step (h) includes the substep of implanting dopant atoms of the second type with an energy from one-tenth (0.1) to one-hundred (100) kilo-electron Volts (KeV) and with a dosage in a range from $10^{13}$ to $10^{18}$ atoms per square centimeter.

49. A method as claimed in claim 25, wherein said steps (g) and (h) are performed simultaneously using the dopants of the second type both to amorphize the source and drain regions as well as to dope the source and drain regions.

50. A method as claimed in claim 25, wherein said step (i) is performed with laser radiant energy.

51. A method as claimed in claim 25, wherein said step (i) is performed with laser radiant energy delivered in from one (1) to ten (10) shots with a pulse width of five (5) to one-thousand (1000) nanoseconds and a fluence of one-tenth (0.1) to one (1.0) Joules per square centimeter at a wavelength of one hundred (100) to one thousand two hundred (1,200) nanometers.

52. A method as claimed in claim 25, wherein the first type of dopant is n-type, and the second type of dopant is p-type.

53. A method as claimed in claim 25, wherein the first type of dopant is p-type, and the second type of dopant is n-type.

54. A method as claimed in claim 25, following step i. further comprising the steps of:

j) forming a first insulator layer over the substrate;

k) patterning the first insulator layer to expose portions of the source and drain regions and the radiant energy absorber layer;

l) forming a metal layer over at least the exposed portions of the source and drain regions and the radiant energy absorber layer;

m) patterning the metal layer to form conductive lines in contact with the source, drain and radiant energy absorber layer; and n) forming a second insulator layer over the substrate to insulate the conductive lines.

55. A method as claimed in claim 25, following step i. further comprising the steps of:

j) removing the radiant energy absorber layer after the performance of said step (i);

k) forming a first insulator layer over the substrate;

l) patterning the first insulator layer to expose portions of the source and drain regions, and the gate region;

m) forming a metal layer over at least the exposed portions of the source and drain regions and the gate region;

n) patterning the metal layer to form conductive lines in contact with the source, drain and gate regions; and o) forming a second insulator layer over the substrate to insulate the conductive lines.

* * * * *